(12) United States Patent
Iranmanesh et al.

(10) Patent No.: US 6,177,691 B1
(45) Date of Patent: Jan. 23, 2001

(54) CELL BASED ARRAY HAVING COMPUTE DRIVE RATIOS OF N:1

(75) Inventors: Ali Akbar Iranmanesh, Sunnyvale; Puneet Sawhney, Mountain View, both of CA (US)

(73) Assignee: Synopsys, Inc., Mountain View, CA (US)

( * ) Notice: Under 35 U.S.C. 154(b), the term of this patent shall be extended for 0 days.

(21) Appl. No.: 09/164,000

(22) Filed: Sep. 30, 1998

Related U.S. Application Data (63) Continuation-in-part of application No. 08/885,148, filed on Jun. 30, 1997.

(51) Int. Cl.$^7$ .......................... H01L 27/11; H01L 27/118
(52) U.S. Cl. ......................... 257/211; 257/206; 257/207; 257/208; 257/390
(58) Field of Search .................................. 257/206, 208, 257/209, 210, 211, 390, 207

(56) References Cited

U.S. PATENT DOCUMENTS

| | | | |
|---|---|---|---|
| 5,055,716 | 10/1991 | El Gamel ............................ | 257/205 |
| 5,079,182 | 1/1992 | Ilderem et al. ...................... | 438/586 |
| 5,325,336 | * 6/1994 | Tomishima et al. ................. | 365/207 |
| 5,444,276 | * 8/1995 | Yokota et al. ....................... | 257/230 |
| 5,742,078 | * 4/1998 | Lee et al. ............................. | 257/202 |
| 5,777,369 | * 7/1998 | Lin et al. ............................. | 257/390 |
| 5,874,754 | 2/1999 | Lee et al. ............................. | 257/206 |

* cited by examiner

Primary Examiner—Leo P. Picard
Assistant Examiner—Hung Van Duong
(74) Attorney, Agent, or Firm—James E. Eakin; McDermott, Will & Emery (57) ABSTRACT

Method and apparatus are disclosed for a low power, high density cell based array structure that permits implementation of designs having compute/drive cell ratios of N:1. The improved performance is provided in part by relocating the substrate and well taps within the compute cell, and in at least some instances by removing the well tap from the drive cell. Further, a extra routing track may be provided by not sharing source/drain areas of adjacent drive cells. Still further, a power mesh may be provided which simplifies routing and improves flexibility.

21 Claims, 8 Drawing Sheets

CELL BASED ARRAY HAVING COMPUTE DRIVE RATIOS OF N:1

RELATED APPLICATION

This application is a continuation-in-part of U.S. patent application Ser. No. 08/885,148, filed Jun. 30, 1997, having a common title and assignee.

FIELD OF THE INVENTION

This application relates to designs for cell based arrays, and particularly relates to low power, high density designs for cell based arrays.

BACKGROUND OF THE INVENTION

The use of gate arrays and standard cells has become well known as an effective and efficient method for rapidly developing new semiconductor products of substantial complexity. Such standard cells are typically used in cell-based arrays, and have wide application within the industry. A widely-accepted design for a gate array architecture that provides standard cell type densities is based on the design described in U.S. Pat. No. 5,289,021, commonly assigned to the assignee of the present invention and incorporated herein by reference.

However, despite the many advantages offered by cell based arrays, prior art designs cells have suffered from some limitations which have become more apparent as line widths have been reduced and complexity has increased. In particular, the typical prior art gate array has been limited to a relatively low ratio between compute and drive cells. More specifically, prior art designs have limited the ratio between compute and drive cells to no more than three- or four-to-one. Moreover, manufacturing limitations have served to impose a fixed, three-to-one limitation on most if not all prior art designs. Although the three-to-one ratio has enabled efficient construction of a great many circuits, and is particularly well suited to many high performance designs, there remain other applications—for example, low power applications—which could benefit from a ratio of compute to drive cells other than (and typically greater than) three-to-one.

As a result, there has been a need to develop a cell based array design which permits the implementation of larger, and in some instances unlimited, ratios of compute to drive cells. In addition, there has been a need to develop an improved power routing system to permit most efficient use of the increased density available with these larger ratios.

SUMMARY OF THE INVENTION

The present invention substantially overcomes the limitations of the prior art by providing an extremely compact cell based array which permits high density, low power designs, including permitting designs implementing a virtually unlimited range of ratios between compute and drive cells. In particular, the present invention involves providing design flexibility to permit the ratio of compute cells to drive cells to be design dependent, and therefor optimized for each particular design. Because of the substantially larger size of the drive cell transistors compared to the compute cell transistors, increasing ratios of compute to drive cells offers significant reduction in power consumption, among other benefits. Further, higher densities can result for designs with high C/D ratios. While the structure is typically implemented as a gate array, many aspects of the invention also have application in standard cell designs. As a result, the present invention is not limited to gate arrays, and reference herein will be made to both types of structures even though the exemplary embodiment is typically a gate array.

The cell based array of the present invention involves a new and novel cell structure which involves rearrangement of the compute cells relative to each other and to any associated drive cells, with the objectives of providing, among other things, lower power, higher density operation with greater optimization. To achieve these goals, an exemplary embodiment of the present invention includes adding a substrate tap to the compute cell and arranging adjacent compute cells to permit the substrate tap to be shared between adjacent compute cells. Further, although optional, the n-well taps preferably abut between adjacent compute cells.

In contrast to the compute cells, however, in at least some embodiments the well and substrate taps are preferably removed from the drive cell. Still further, in at least a presently preferred embodiment the source/drain areas of the transistors for adjacent drive cells is separated, thereby improving routability by providing an extra routing track between the drive cells. In addition, flexibility is improved because the two cells need not be connected.

Still further, additional performance gains may be provided by, in at least some embodiments, adding additional polysilicon heads to the drive cell while at the same time minimizing the number of bent gates to effectively increase channel width of the drive cell's PMOS device.

In addition, another aspect of the present invention includes a power mesh of an arrangement of criss-crossing power rings which surround the core and are supplied power from the VDD and GND I/O pads. In turn the power rings supply VDD and GND to the core through a Primary as well as a Supplemental Power mesh as discussed hereinafter. This provides the design with the flexibility to support a wide range of C:D ratios, and particularly a range of C:D ratios from 3 to 13 although a broader range is within the scope of the invention. The power mesh design, taken together with the broad range of C:D ratios, allows users to gain maximum density advantage from the architecture.

The power mesh, or power routing scheme, is implemented in a two-tiered arrangement. Primary power routing is provided by means of two conductive layers arranged in the horizontal direction, plus an additional layer in the vertical direction. Optional secondary or supplemental power routing is by a fourth conductive layer in the vertical direction, plus the horizontal portion of the primary conductive layer can be supplemented by an overlying conductive layer in the same direction. The conductive layer typically, but not necessarily, is a metal layer. Also, the CBAII core cells have been designed with at least one n-well & substrate contact each inside every cell to avoid latchup problems.

The invention is particularly well-suited to complex integrated circuits such as cell-based arrays, but may be successfully implemented in a wide variety of circuit designs. Although the invention is explained in the context of a cell-based array, it is to be understood that such an embodiment is exemplary only and not limiting. Likewise, the power mesh described here is exemplary only and may be implemented in a variety of designs.

The foregoing and other advantages of the present invention may be better appreciated from the following Detailed Description of the Invention, taken together with the attached Figures.

DETAILED DESCRIPTION OF THE INVENTION

Figure 1:
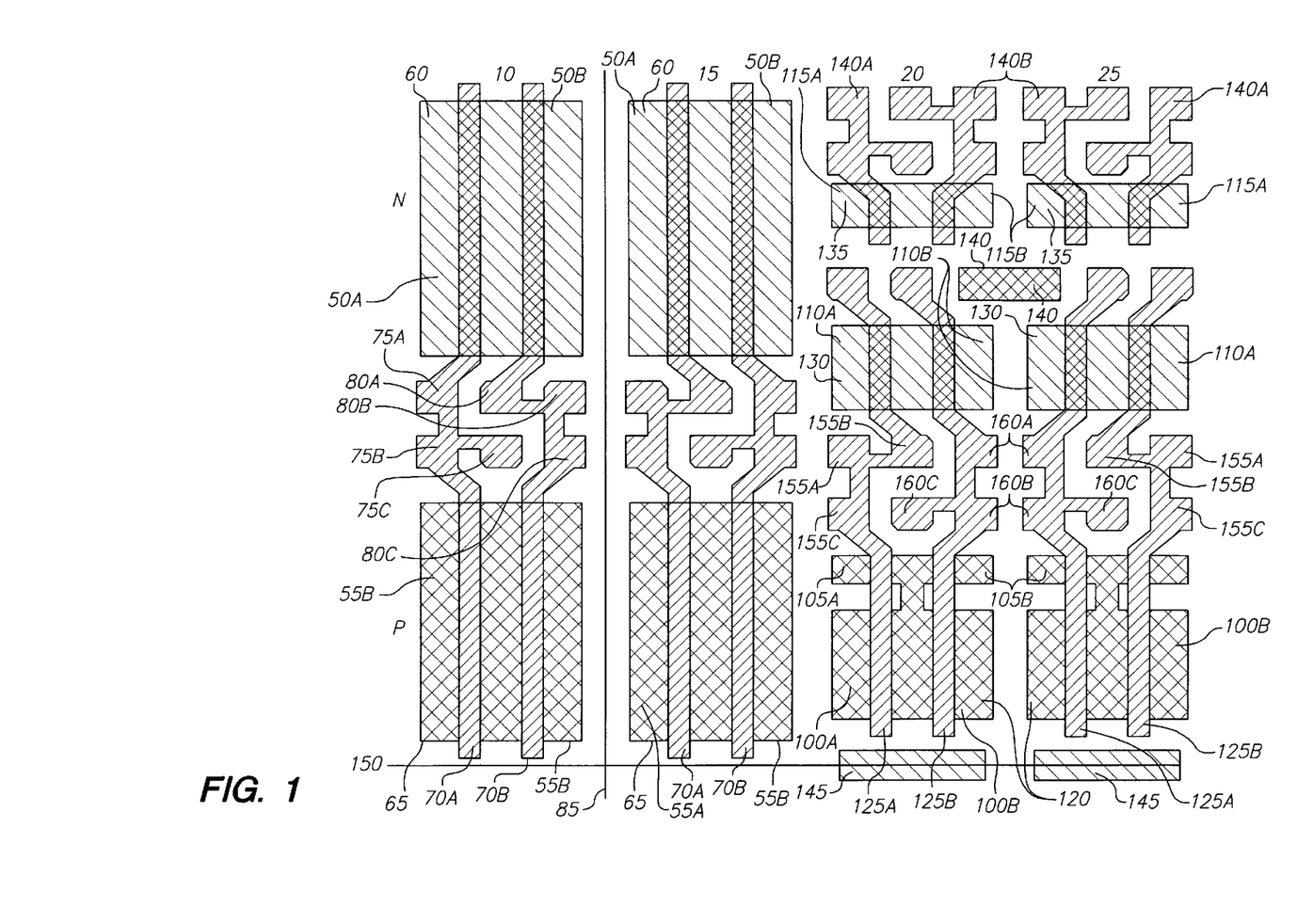
FIG. 1 shows an exemplary cell arrangement using a presently preferred structure of the present invention.
Figure 2:
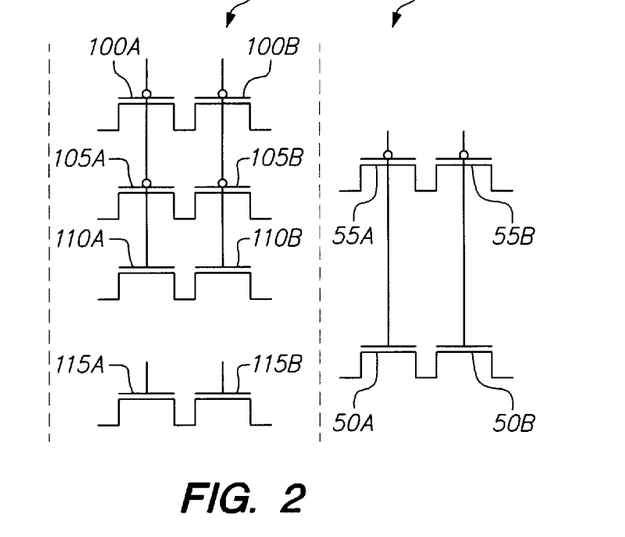
FIG. 2 shows the circuit diagram for the drive and compute portions of FIG. 1.

Referring first to FIGS. 1 and 2, first and second drive cells 10 and 15, respectively are juxtaposed with first and second compute cells 20 and 25. Each of the drive cells 10 and 15 can be seen to comprise transistors significantly larger than the compute cells 20 and 25. As will be appreciated hereinafter, the compute cells 20 and 25 are typically associated with the drive cell 15, while the drive cell 10 is associated with other compute cells to its left and not shown in FIG. 1. In addition, in the exemplary embodiment of FIG. 1, the compute cells 20 and 25 can be seen to be mirror images of one another. Such mirror image arrangement can be helpful but is not required. In contrast, the drive cells 10 and 15 are not mirror images of one another.

It will be appreciated that, although the following description refers to rows and columns, these terms are essentially interchangeable in the context of the invention and "row" oriented designs may be readily reconfigured to be "column" oriented designs. As a result, use of the terms "row" or "column" throughout this document are not intended to be limiting but simply are used for ease of reference. In contexts appropriate in the art, "row" should be understood to mean "column" and vice versa.

Still with reference to FIGS. 1 and 2, each drive cell comprises a pair of N-type transistors 50A–B and a second pair of P-type transistors 55A–B. The layout of the transistors, best seen in FIG. 1, includes an N-well portion 60 and a P-well portion 65. Polysilicon gates 70A–B connect the N and P wells or diffusions to form the transistors as shown in FIG. 2. One additional aspect of the drive cells of FIG. 1 is that neither drive cell includes either an N-well tap or a substrate tap.

In addition, each of the gates 70A–B includes multiple polysilicon heads 75A–C and 80A–C, respectively. Importantly, in the exemplary embodiment of FIG. 1, the source and drain areas between adjacent drive sections is not shared. This permits an extra routing track 85 to be placed between the drive cells 10 and 15, thus improving routability of designs developed from the array shown in FIG. 1. In addition, the mulitple polysilicon heads 75A–C and 80A–C permit easier connectivity by reducing wiring congestion and routing utilization. Further, the removal of the substrate taps and well taps from the drive sections permits easier layout and improves yield.

With reference to the compute portion of FIGS. 1 and 2, the transistors in the compute cells 20 and 25 can be better appreciated. As with the drive cell portion, the compute cell transistors are arranged in pairs. The transistor pairs shown in layout form in FIG. 1 are shown in FIG. 2 in schematic form, and comprise P-type pairs 100A–B and 105A–B, as well as N-type pairs 110A–B and 115A–B. With particular reference to FIG. 1, the layout of transistor pairs 100A–B, best seen in FIG. 1, can be seen to comprise P-diffusion 120 together with polysilicon gates 125A–B. In addition, a pair of N-type diffusions 130 and 135 in each compute cell, together with extensions to gates 125A–B as well as additional polysilicon gates 140A–B, permits construction of transistor pairs 110A–B and 115A–B. It will be appreciated that the P-type transistor pair 100A–B is larger than P-type transistor pair 105A–B. Likewise, N-type transistor pair 110A–B is larger than N-type transistor pair 115A–B. There can thus be seen to be four sizes of transistors (two different PMOS sizes and two different NMOS sizes) in a single compute cell 20. However, the particular sizes of the respective transistors can be optimized according to a variety of criteria, and thus the relative transistor sizes shown herein is merely exemplary and not limiting.

In addition, each compute cell includes a substrate tap 140 which, at least in the exemplary embodiment of FIG. 1 though not necessarily, abuts the is substrate tap 140 of the adjacent compute cell. Likewise, an N-well tap 145 is constructed for each compute cell. The N-well taps 145 are typically tied together electrically by conductive run 150. Like the drive cells, the polysilicon gates include multiple polysilicon heads 155A–C and 160A–C.

Figure 3:
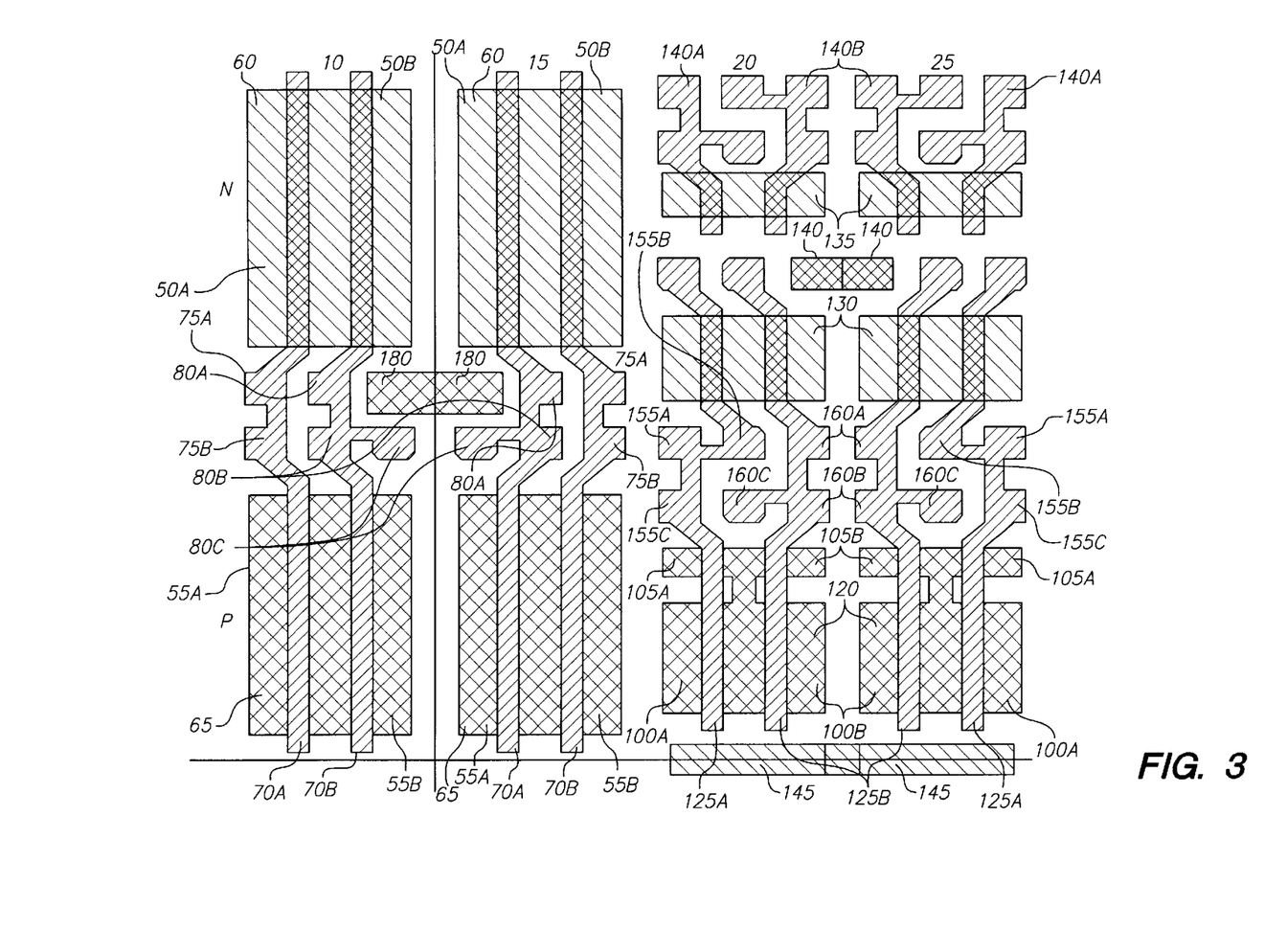
FIG. 3 shows an exemplary cell arrangement using an alternative structure of the present invention.

Referring next to FIG. 3, an alternative to the cell layout of FIG. 1 is shown. For simplicity, and in view of the substantial similarity between FIGS. 1 and 3, like elements have been given like serial numbers. In particular, FIG. 3 shows a substrate tap 180 in each drive cell, with the substrate taps 180 of adjacent drives cells 10 and 15 abutting one another. In addition, the N-well taps 145 in adjacent compute cells are shown abutting one another in FIG. 3, whereas they are not abutting in FIG. 1. To accommodate the substrate taps 180, one poly head 75 has been eliminated from polysilicon gate 70A. To minimize risk of latch-up, the core cells of the array typically include at least one n-well and substrate contact each inside every cell.

Figure 4:
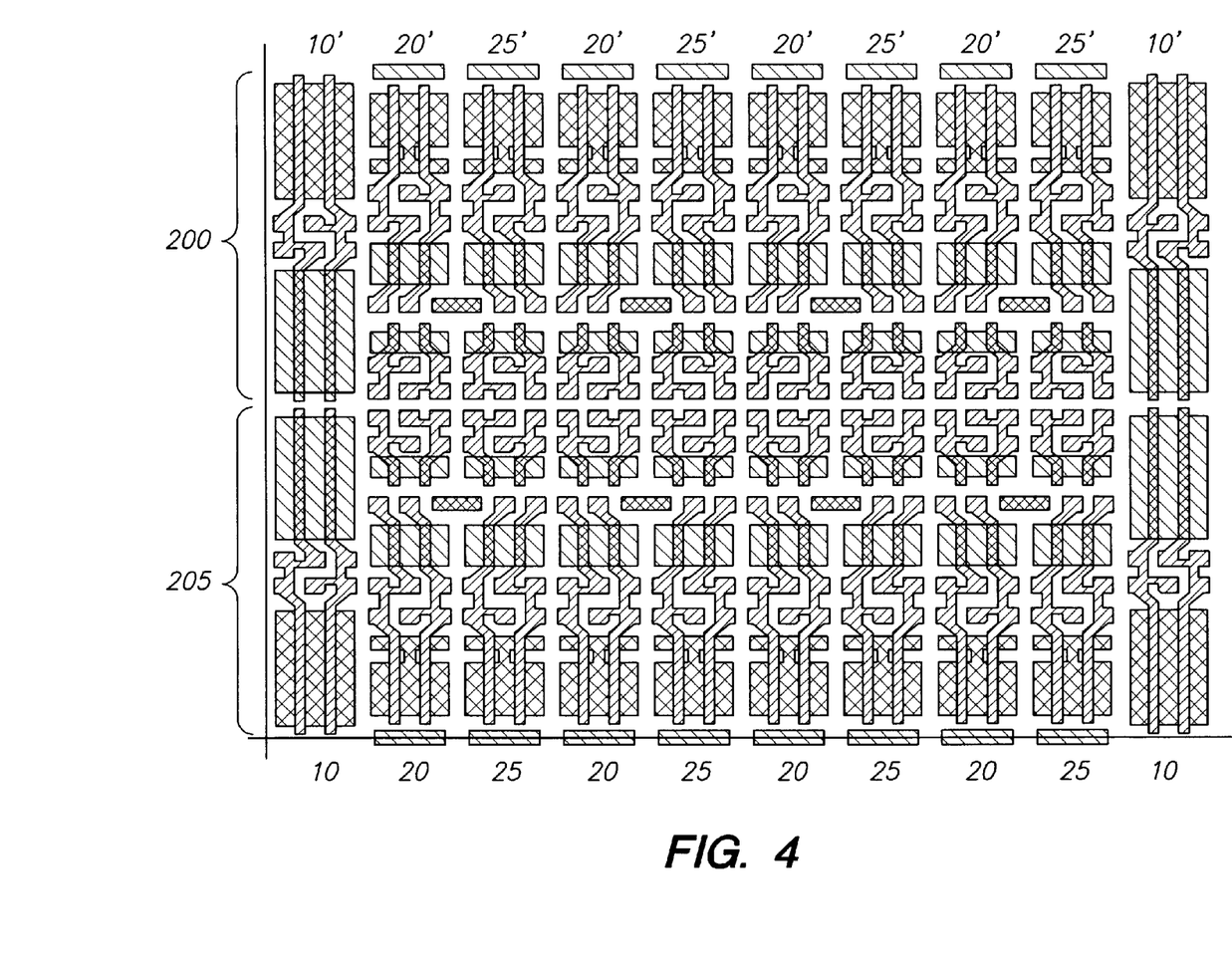
FIG. 4 shows a portion of a base array constructed in accordance with the present invention, including an arrangement of a 4:1 ratio between compute and drive cells within a device.

Referring next to FIG. 4, a portion of a cell array is shown. In particular, the portion of the array shown in FIG. 4 can be seen to comprise an upper row 200 and a lower row 205, with the upper row 200 the mirror image of the lower row 205. In each row, a plurality of four compute cells 20 (or 20') are shown arrayed alternately with four compute cells 25 (or 25'). Outboard of the compute cells, at either end, is a drive cell 10 or 10'. In a typical arrangement half of the compute cells in each row are associated with the closest drive cell in that row, or a ratio of 4:1.

Figure 5:
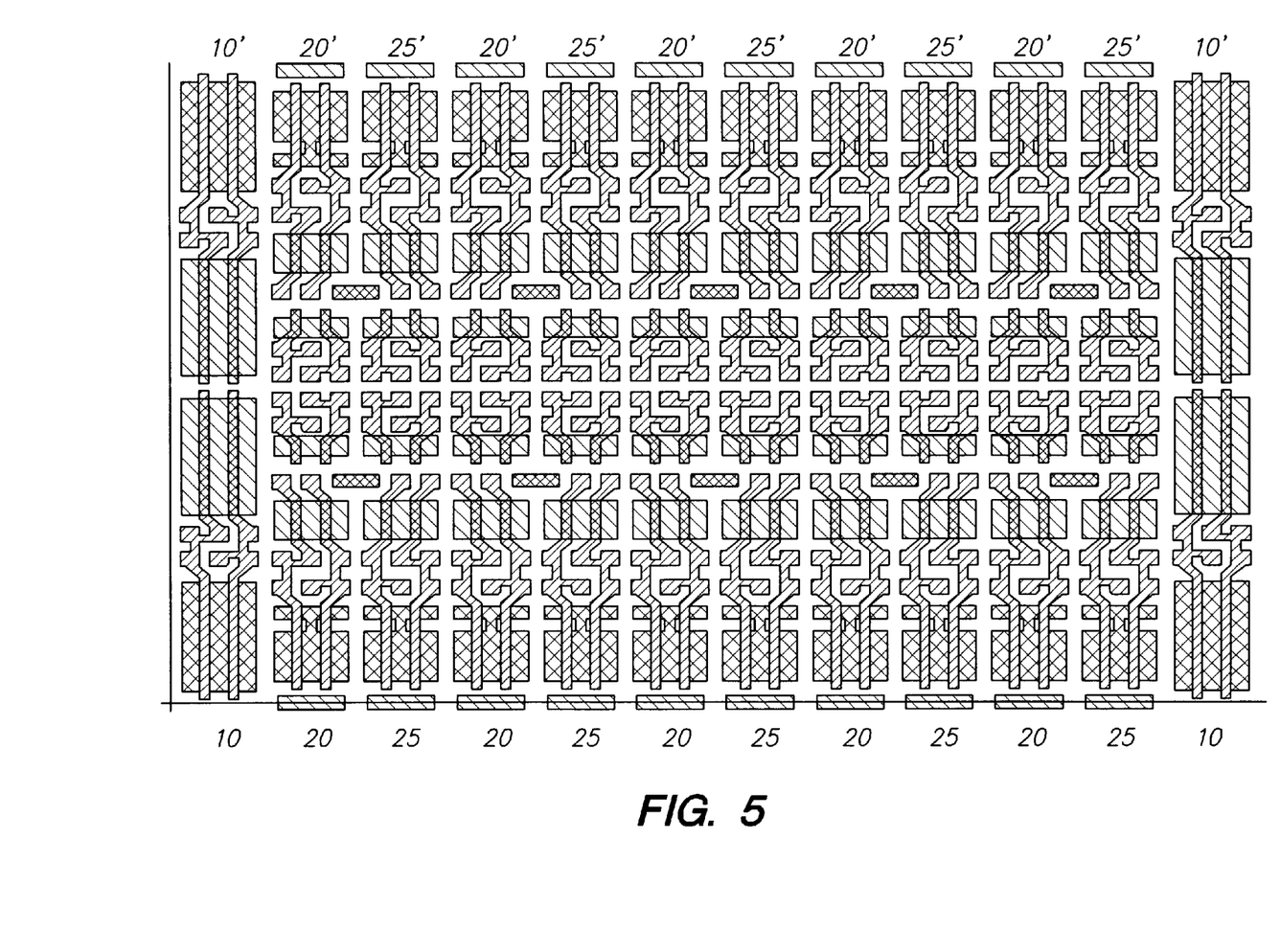
FIG. 5 shows a portion of a base array constructed in accordance with the present invention, including an arrangement of a 5:1 ratio between compute and drive cells within a device.
Figure 6:
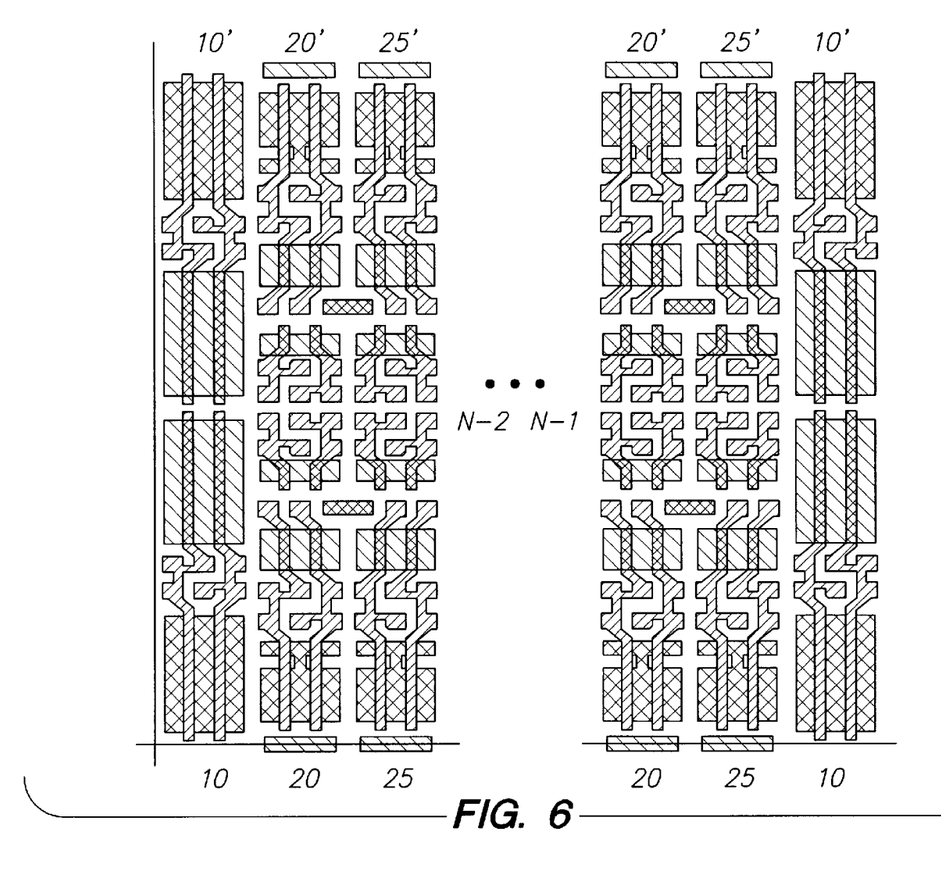
FIG. 6 shows a generalized version of FIG. 5, for an N:1 ratio.

In a significant departure from the prior art, the cell structure of the present invention permits virtually any ratio of compute cells to drive cells, instead of the 3:1 ratio typically found in the prior art. Thus, as shown in FIG. 5, the cell structure of the present invention permits compute/drive ratios of 5:1 or higher. For convenience, elements in FIG. 5 have been assigned their analogous reference numerals from FIG. 4. The ratio of compute to drive cells with the present invention may be expressed generally as N:1, where N is any desired integer, as shown generally in FIG. 6. In addition, if desired, an array of only compute cells could be configured, or a ratio of N:0; or, in at least some embodiments, an odd number of cells could be disposed between the drive cells.

Figure 7:
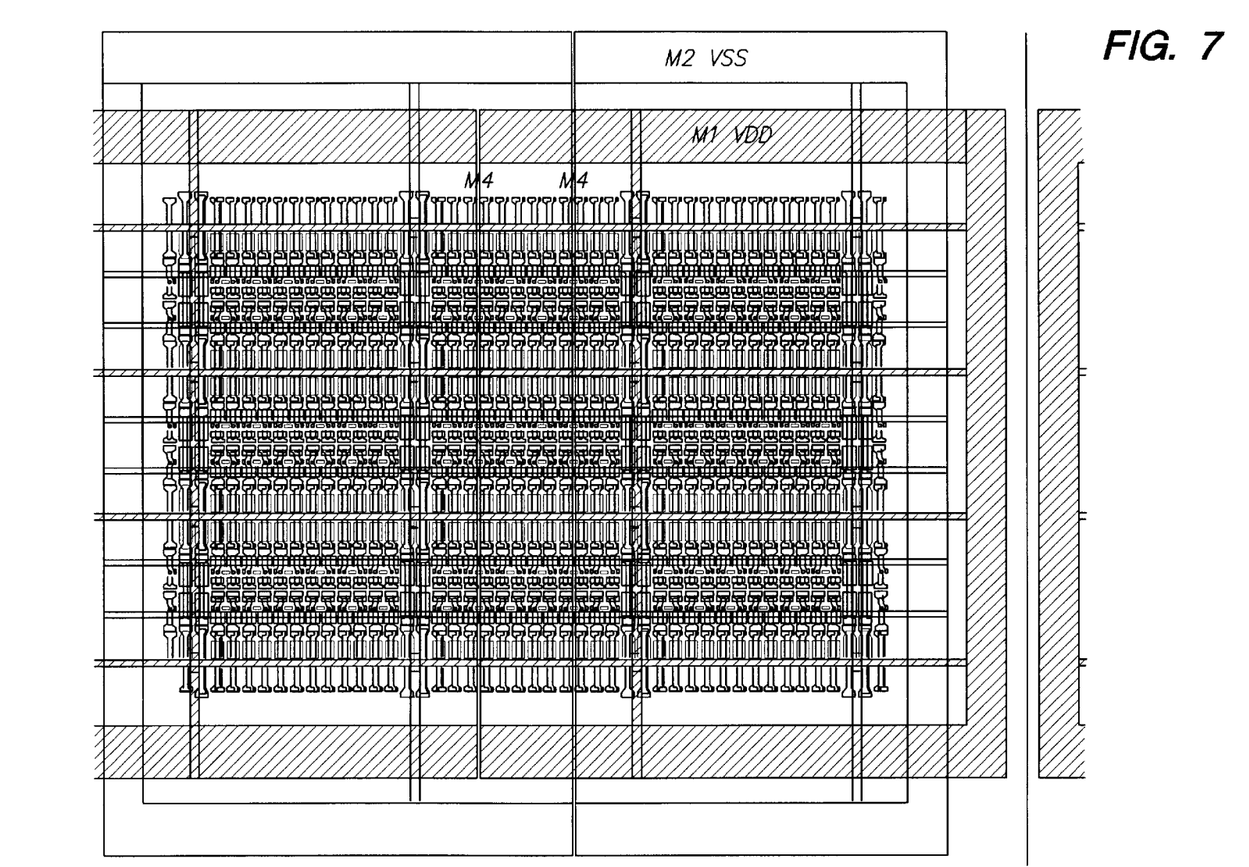
FIG. 7 shows power rings which form part of a power mesh in accordance with the present invention.
Figure 8:
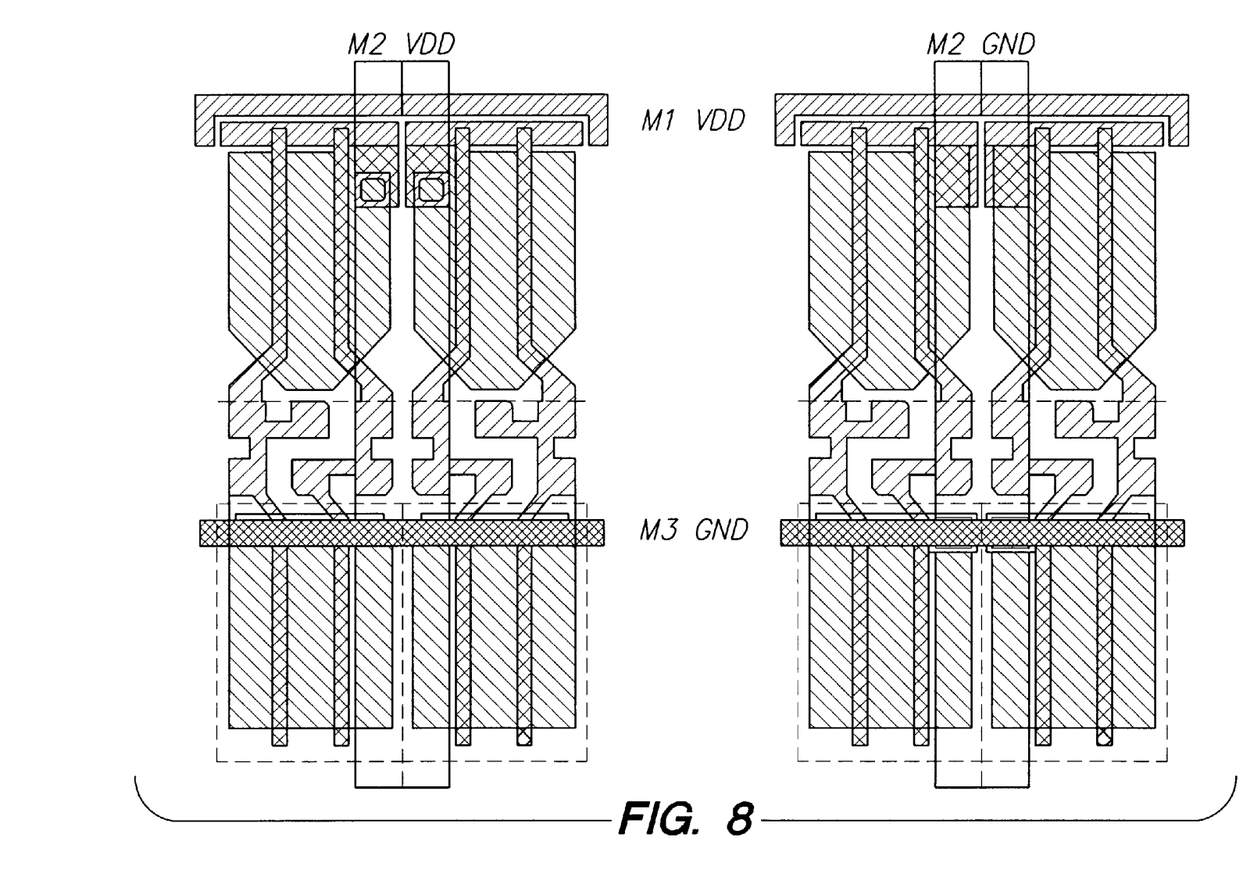
FIG. 8 shows primary power routing in the array of the present invention.
Figure 9:
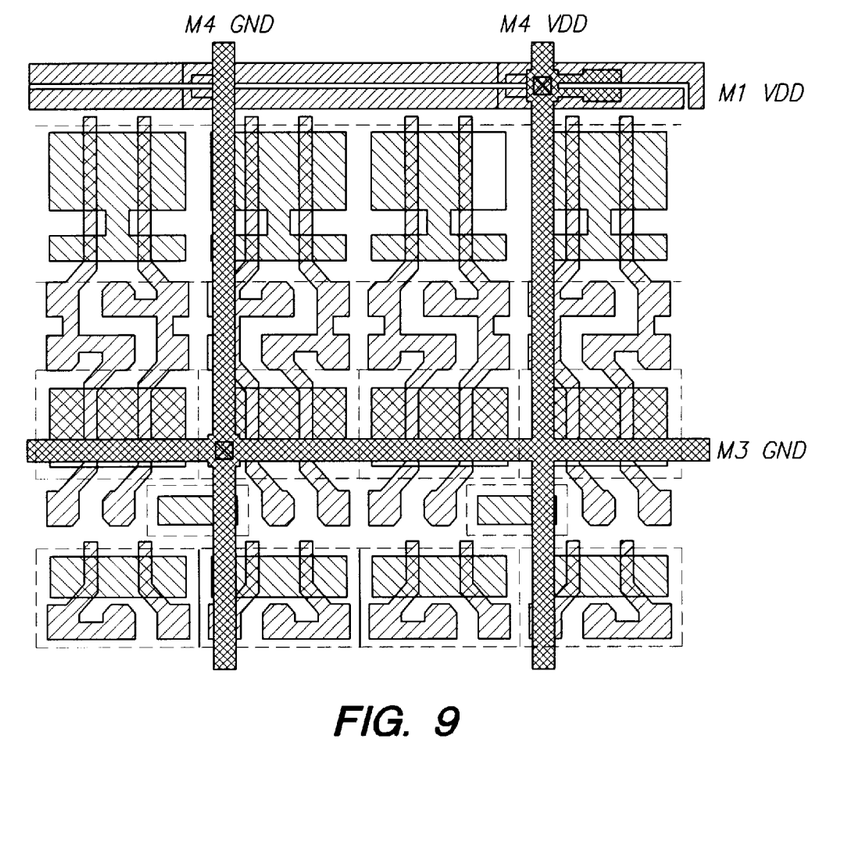
FIG. 9 shows secondary or supplemental power routing in the array of the present invention.

To further optimize the performance of gate array and standard cell designs which include the flexible C:D ratios described hereinabove, a power mesh has been designed as a related aspect of the present invention. Referring to FIGS. 7, 8 and 9, the power mesh of the present invention may be better appreciated.

From FIG. 7, it can be appreciated that the cell based array core is surrounded by crisscrossing power rings in a first conductive layer 700, which for convenience may be referred to as Metal1 (VDD), and a second conductive layer 705 which may be referred to as Metal2 (GND). The rings 700 and 705 are supplied power from the VDD and GND I/O pads and, in turn, supply VDD and GND to the array core through a two-tiered arrangement which comprises a primary and a secondary power mesh as described below.

With reference to FIG. 8, the primary power routing can be seen to include the first conductive layer 700, or Metal1, conducting VDD as well as a third conductive layer 710, or Metal3 for GND in the horizontal direction. In addition, the primary tier also includes use of the second conductive layer 705 or Metal2 for both VDD and GND in the vertical direction.

With this arrangement, each row of compute and drive cell has a VDD bus and GND bus running in the horizontal direction. The VDD bus is typically shared between two rows and may be run in a wide Metal1, for example a run which is on the order of thirty percent wider than a regular width run in a 0.35 $\mu$m environment. However, there is a regular width Metal3 GND bus in each row. Thus each row can be considered to be supplied VDD and GND by a dedicated regular width wire. This mesh is contained in the layout of each array cell, including filler cells, and is completed by abutment at the chip level.

In addition, a primary vertical power mesh may be provided in Metal2 for supplying VDD and GND alternatively. The vertical power stripe (either VDD or GND) runs between two adjacent drive sections and covers two tracks. Thus, for example, for a 0.35 $\mu$m process, the vertical power stripes are approximately 30% wider in the present invention as compared to conventional designs.

In addition, in at least some designs, it is desirable to include a second tier or supplemental power mesh as shown in FIG. 9. This optional supplemental power routing may be provided by a fourth conductive layer 715, or Metal4, for both VDD and GND in the vertical direction. In addition, the supplemental power mesh may also include use of a horizontal portion of the first conductive layer 700, or Metal1, VDD can be supplemented by an overlying Metal3 in the same direction.

The supplemental power tier shown in FIG. 9 avoids excessive IR drop over the horizontal power buses between the adjacent vertical stripes. In addition, if desired, it is also possible to provide supplemental power stripes in Metal4 over the compute sections. This feature may be particularly useful, although not always necessary, in high power designs or those with very high C:D ratios as the distance between two adjacent Metal2 VDD or GND stripes increases with increasing C:D ratio. These Metal4 stripes can be one or two tracks wide and also the number of these stripes per each "core unit" can be customized. These additional features can be provided based on considerations of reliability, for example power consumption, voltage drop, electron migration and so on.

Still further, a horizontal Metal3 bus can be run over the Metal1 VDD bus to supplement the horizontal VDD routing. The Metal3 GND bus is supplemented inside each core cell with local Metal1 GND wherever needed.

From the foregoing, it can be appreciated that a new and novel technique for providing highly flexible, high density, low power cell array structures has been disclosed. The technique also has the advantage, in at least some embodiments, of permitting better flexibility, routability and yield, as well as area and performance advantages. Having fully described one embodiment of the present invention, it will be apparent to those of ordinary skill in the art that numerous alternatives and equivalents exist which do not depart from the invention set forth above. It is therefore to be understood that the invention is not to be limited by the foregoing description, but only by the appended claims.

What is claimed is:

1. In a mask programmable array comprising a plurality of cells arranged in at least either rows or columns, a power mesh comprising a first bus for supplying power running in a first direction, a second bus for providing a ground running substantially parallel to the first bus, and a plurality of rows of cells including compute and drive cells positioned to be supplied a voltage potential by the first and second buses, wherein a ratio of compute cells to drive cells is N to M, and wherein N and M are non-negative integers.

2. The mask programmable array of claim 1, wherein N is at least 4, and wherein M is 1.

3. The mask programmable array of claim 1, wherein the drive cells lack an N-well tap.

4. The mask programmable array of claim 1, further comprising a routing track positioned between adjacent drive cells, wherein the routing track is configured to improve routability.

5. In a mask programmable array comprising a plurality of cells arranged in at least either rows or columns, a power mesh comprising a first bus for supplying a first potential running in a first direction, a second bus for providing a second potential running substantially parallel to the first bus, a third bus for supplying one of the first two potentials running substantially perpendicular to the first direction, and a plurality of cells including compute and drive cells arranged in sections and positioned to be supplied a voltage potential by the first, second and third buses and wherein the third bus runs between two adjacent drive sections, wherein a ratio of compute cells to drive cells is N to M, and wherein N and M are non-negative integers.

6. The mask programmable array of claim 5, wherein N is at least 4, and wherein M is 1.

7. The mask programmable array of claim 5, wherein the drive cells lack an N-well tap.

8. The mask programmable array of claim 5, further comprising a routing track positioned between adjacent drive cells, wherein the routing track is configured to improve routability.

9. In a mask programmable array comprising a plurality of cells arranged in at least either rows or columns, a power mesh comprising a first tier comprising a first bus for supplying a first potential running in a first direction, a second bus for providing a second potential running substantially parallel to the first bus, a second tier comprising a conductive layer in a direction substantially perpendicular to the first direction and configured with portions to provide both the first and second potentials, and a plurality of cells including compute and drive cells arranged in sections wherein the cells are provided both first and second voltage potentials from the first and second buses and the conductive layer without experiencing significant voltage drop along the buses, wherein a ratio of compute cells to drive cells is N to M, and wherein N and M are non-negative integers.

10. The mask programmable array of claim 9, wherein N is at least 4, and wherein M is 1.

11. The mask programmable array of claim 9, wherein the drive cells lack an N-well tap.

12. The mask programmable array of claim 9, further comprising a routing track positioned between adjacent drive cells, wherein the routing track is configured to improve routability.

13. The mask programmable array of claim 9, wherein the second tier of the power mesh assists in avoiding significant voltage drop along the buses.

14. The mask programmable array of claim 9, wherein the power mesh is a substantially high power design.

15. The mask programmable array of claim 9, wherein the ratio of compute cells to drive cells is substantially high.

16. In a mask programmable array comprising a plurality of cells arranged in at least either rows or columns a power mesh comprising:

a primary power routing including
a Metal1 power stripe for conducting a VDD running in a first direction,
a Metal3 power stripe for conducting a GND running substantially parallel to Metal1,
a Metal2 power stripe running in a direction substantially perpendicular to the first direction and configured with portions to provide both the VDD and the GND; and a plurality of cells including compute and drive cells arranged in sections wherein the cells are provided both VDD and GND from the power stripes without experiencing significant voltage drop along the Metal1 and Metal3 power stripes, wherein a ratio of compute cells to drive cells is N to M, and wherein N and M are non-negative integers.

17. The mask programmable array of claim 16, further comprising:

a supplemental power routing including a Metal4 power stripe running in a direction substantially perpendicular to the first direction and configured with portions to provide both the VDD and the GND, wherein the supplemental power routing is configured to avoid excessive voltage drop over the Metal1 and Metal3 power stripes between a set of adjacent Metal4 stripes.

18. The mask programmable array of claim 16, wherein N is at least 4, and wherein M is 1.

19. The mask programmable array of claim 16, wherein the drive cells lack an N-well tap.

20. The mask programmable array of claim 16, further comprising a routing track positioned between adjacent drive cells, wherein the routing track is configured to improve routability.

21. The mask programmable array of claim 17, further comprising supplemental Metal4 power stripes, wherein the ratio of compute cells to drive cells is substantially high.

* * * * *